United States Patent
Sen et al.

(10) Patent No.: US 9,082,775 B2
(45) Date of Patent: Jul. 14, 2015

(54) SYSTEM FOR ENCAPSULATION OF SEMICONDUCTOR DIES

(75) Inventors: Amlan Sen, Singapore (SG); Chin Guan Khaw, Singapore (SG)

(73) Assignee: Advanpack Solutions Pte Ltd, Singapore (SG)

( * ) Notice: Subject to any disclaimer, the term of this patent is extended or adjusted under 35 U.S.C. 154(b) by 300 days.

(21) Appl. No.: 13/129,398

(22) PCT Filed: Nov. 17, 2009

(86) PCT No.: PCT/SG2009/000429
§ 371 (c)(1),
(2), (4) Date: Jul. 27, 2011

(87) PCT Pub. No.: WO2010/056211
PCT Pub. Date: May 20, 2010

(65) Prior Publication Data
US 2011/0271902 A1    Nov. 10, 2011

Related U.S. Application Data

(60) Provisional application No. 61/115,505, filed on Nov. 17, 2008.

(51) Int. Cl.
*H01L 21/56* (2006.01)
*H01L 23/31* (2006.01)
*H01L 23/00* (2006.01)

(52) U.S. Cl.
CPC ............ *H01L 21/56* (2013.01); *H01L 23/3121* (2013.01); *H01L 24/97* (2013.01); *H01L 21/561* (2013.01); *H01L 2224/32225* (2013.01); *H01L 2224/32245* (2013.01);

(Continued)

(58) Field of Classification Search
USPC .................. 425/89, 127, 129.1, 544
See application file for complete search history.

(56) References Cited

U.S. PATENT DOCUMENTS 3,754,846 A * 8/1973 Choate .......................... 425/125
4,843,036 A    6/1989 Schmidt et al.
(Continued)

FOREIGN PATENT DOCUMENTS

CN    101093808 A    12/2007
EP        470559 A1    2/1992
(Continued)

OTHER PUBLICATIONS

International Search Report of PCT/SG2009/000429 completed on May 11, 2010 by the Austrian Patent Office and mailed on May 24, 2010 (4 pages).

(Continued)

*Primary Examiner* — Robert B Davis
(74) *Attorney, Agent, or Firm* — Pyprus Pte Ltd

(57) ABSTRACT

The present invention describes two systems (100, 300) for encapsulation of semiconductor dies. Both systems (100, 300) involve attaching an encapsulation spacer (102, 302, 302a, 302b) having one or more apertures (104, 304) on an associated substrate (150) so that a group of chips is located within the aperture (104, 304). The first system (100) involves dispensing encapsulant (103) directly into an aperture. The second system (300) involves attaching an encapsulant delivery layer (350, 351) onto the encapsulation spacer and discharging encapsulant into an aperture via a recessed gate (308).

13 Claims, 8 Drawing Sheets

(52) U.S. Cl.
CPC .............. *H01L 2224/48091* (2013.01); *H01L 2224/48227* (2013.01); *H01L 2224/48247* (2013.01); *H01L 2224/48465* (2013.01); *H01L 2224/73204* (2013.01); *H01L 2224/73265* (2013.01); *H01L 2224/97* (2013.01)

(56) References Cited

U.S. PATENT DOCUMENTS

| | | | |
|---|---|---|---|
| 5,098,626 A * | 3/1992 | Pas | 264/151 |
| 5,200,366 A * | 4/1993 | Yamada et al. | 29/841 |
| 5,365,655 A * | 11/1994 | Rose | 29/827 |
| 5,431,854 A * | 7/1995 | Pas | 264/328.5 |
| 5,843,360 A * | 12/1998 | Dannenberg | 264/272.14 |
| 5,888,443 A * | 3/1999 | Bolanos et al. | 264/328.5 |
| 5,891,384 A * | 4/1999 | Miyajima | 264/511 |
| 5,912,024 A * | 6/1999 | Bolanos et al. | 425/116 |
| 5,955,115 A * | 9/1999 | Bolanos et al. | 425/116 |
| 6,060,779 A | 5/2000 | Machii | |
| 6,071,457 A * | 6/2000 | Bednarz et al. | 264/272.17 |
| 6,080,354 A | 6/2000 | Miyajima | |
| 6,379,997 B1 * | 4/2002 | Kawahara et al. | 438/106 |
| 6,531,083 B1 * | 3/2003 | Bolanos et al. | 264/272.13 |
| 6,696,006 B2 | 2/2004 | Abela et al. | |
| 2003/0143779 A1 | 7/2003 | Ochiai et al. | |
| 2006/0279021 A1 * | 12/2006 | Shinma | 264/272.17 |

FOREIGN PATENT DOCUMENTS

| | | |
|---|---|---|
| EP | 665584 A1 * | 8/1995 |
| WO | WO2008103603 A1 | 8/2008 |

OTHER PUBLICATIONS

First Office Action of Chinese application No. 200980149327.2 dated Jan. 25, 2013 (16 pages).
Second Office Action of Chinese application No. 200980149327.2 dated Oct. 18, 2013 (13 pages).

* cited by examiner

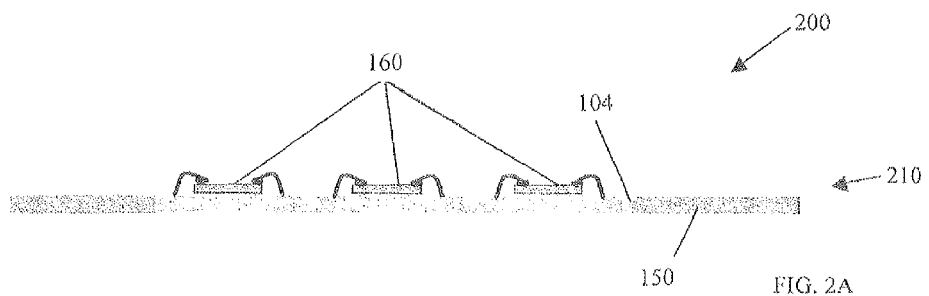
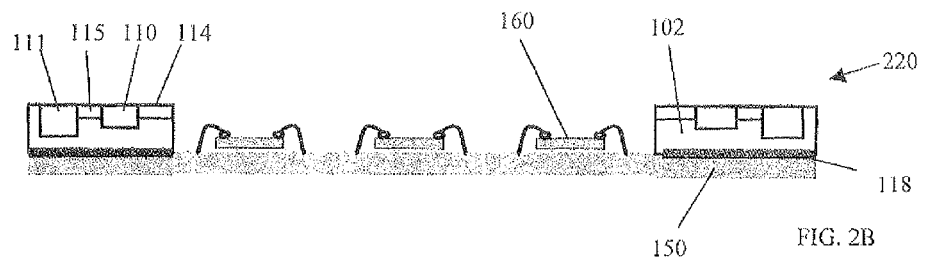
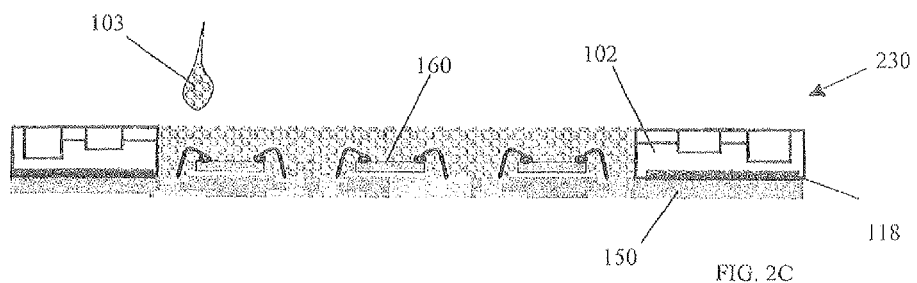
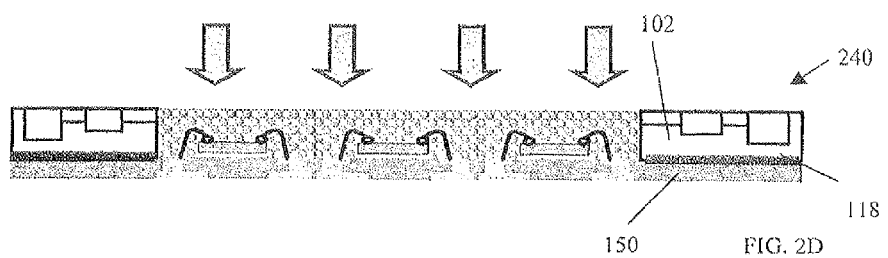

SYSTEM FOR ENCAPSULATION OF SEMICONDUCTOR DIES

RELATED APPLICATIONS

A corresponding PCT patent application is filed on the same day as this case but it relates to the methods of encapsulating semiconductor dies.

FIELD OF INVENTION

The present invention relates to system for encapsulation of semiconductor dies that does away with cavity moulds associated with injection or transfer molding. In particular, this invention relates to a system of discharging encapsulant into a cavity defined by an encapsulation spacer disposed on an associated substrate or carrier.

BACKGROUND

Conventional methods used in semiconductor die packaging involve the process of die bonding, wire bonding, encapsulation moulding, deflashing and singulation. Transfer moulding is typically used to encapsulate a group of semiconductor dies and the respective bonded wire interconnections with a conductive substrate to form a semiconductor package. In the process, the conductive substrate, with wire bonded dies, is placed in a lower mould plate of split-cavity. By clamping the upper mould plate onto the lower mould plate with a periphery of the substrate in between the split mould plates, injecting a liquefied encapsulant into the mold cavity, and allowing the encapsulant to cure, the dies are physically sealed and protected from the external environment. By singulating the semiconductor package, individual semiconductor chips are obtained.

Due to the use of high pressure in delivering the encapsulant, some of the bond wires may be dislodged or moved into contact with an adjacent bond wire. The other problem area is to design reservoirs, runners, gates and air vents to give encapsulant flow characteristics that are sufficient to meet void-free encapsulation. These moulds are expensive and require constant cleaning to remove the encapsulant from channels inside the moulds.

It can thus be seen that there exists a need for new systems and methods of encapsulating semiconductor dies by overcoming disadvantages of the existing prior art.

SUMMARY

The following presents a simplified summary to provide a basic understanding of the present invention. This summary is not an extensive overview of the invention, and is not intended to identify key features of the invention. Rather, it is to present some of the inventive concepts of this invention in a generalised form as a prelude to the detailed description that is to follow.

The present invention seeks a simple and cost effective system for encapsulating semiconductor dies by doing away with conventional cavity moulds associated with injection or transfer moulding; in effect, the costs of making the toolings for the encapsulation spacer are lower than that for making the conventional cavity moulds. With the present invention, a small and simple press, such as a 4-pole press, with simple platen and pressure plate, is sufficient for use with this invention. These tooling are generally simple and flat metal parts and obviate the need for constant cleaning, as in the case of cavity moulds, and this translate to higher productivity in the use of this invention.

In another embodiment, the present invention provides a system for semiconductor packaging. The system comprises: an encapsulation spacer (102, 302), which is shaped and dimensioned to match a substrate/carrier (150); wherein the encapsulation spacer (102, 302) has one or more apertures (104, 304) such that semiconductor dies (160) on the substrate/carrier (150) are disposed inside an associated aperture when the encapsulation spacer (102, 302) is attached to the substrate/carrier (150), and a volume defined by each of the one or more apertures (104, 304) and the substrate/carrier is operable to be filled with an encapsulant (103).

In one embodiment, the encapsulation spacer having a plurality of apertures is in the form of a panel; in another, the encapsulation spacer having a single aperture is in the form of a ring. In another embodiment, the encapsulation spacer is of a unitary layer; in another, the encapsulation spacer comprises two or more layers.

BRIEF DESCRIPTION OF THE DRAWINGS

This invention will be described by way of non-limiting embodiments of the present invention, with reference to the accompanying drawings, in which:

FIGS. 2A-2G illustrate the various steps involved in using the encapsulation system shown in FIG. 1A;

DETAILED DESCRIPTION

Figure 1A:
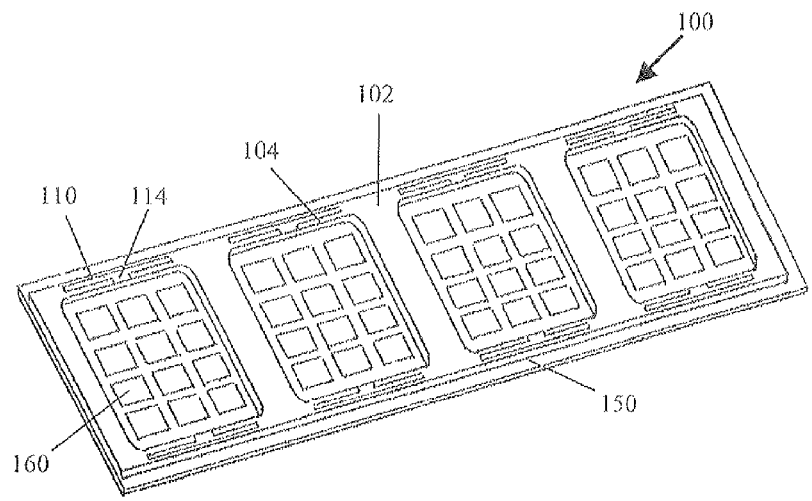
FIG. 1A illustrates an encapsulation system according to an embodiment of the present invention.

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

FIG. 1A shows an encapsulation system 100 according to an embodiment of the present invention. As shown in FIG. 1A, the encapsulation system 100 is made up of an encapsulation spacer 102 being attached to a semiconductor substrate or carrier 150. One semiconductor die or chip 160 or more is/are attached to the substrate/carrier 150 according to a conductive pattern on the substrate/carrier. The die/chip 160 may be a wire-bonded device and the substrate 150 is an associated wiring board, such as a QFN leadframe, a flexible substrate, a ball grid substrate, etc. The encapsulation spacer 102 has a plurality of through apertures 104. FIG. 1A shows a simple encapsulation spacer 102 having one row of apertures 104 for ease of description, where a group of dies/chips 160 are located inside each aperture 104 when the encapsulation spacer 102 is attached to a substrate/carrier 150. Along one or more sides of each aperture 104, there is/are overflow reservoir(s) 110. Thickness of the aperture 104 is predetermined according to height of the die/chip 160 to be encapsulated and the amount of overfill on top of the die/chip. Each overflow reservoir 110 is connected to the respective aperture 104 by air vents 114. By filling the apertures 104 with an encapsulant 103, applying heat and pressure on the encapsulant so as to minimise any void space therein, allowing the encapsulant to cure and then singulating the encapsulated dies/chips into individual packages, the encapsulation system 100 provides a simple and cost effective method to form semiconductor packages.

Figure 1B:
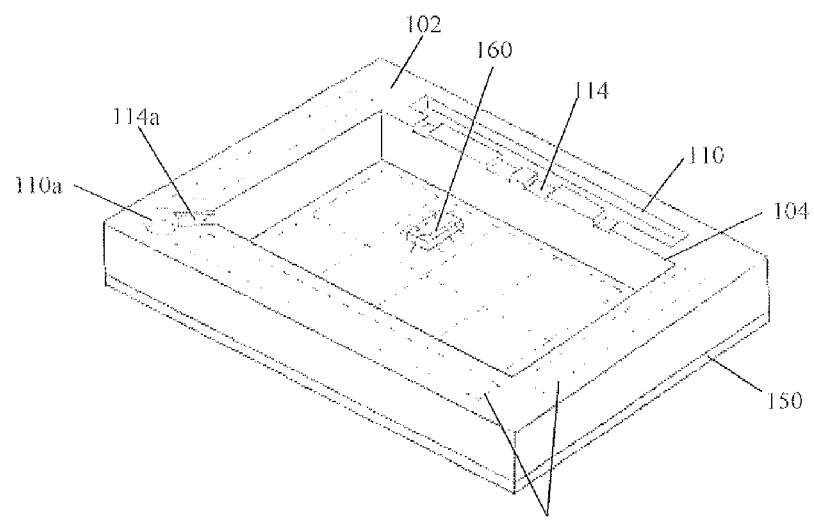
FIG. 1B illustrates an encapsulation spacer according to an embodiment of the encapsulation system shown in FIG. 1A.

The encapsulation spacer 102 need not be in the form of a panel as shown in FIG. 1A. In another embodiment, an encapsulation spacer is formed as an individual encapsulation ring 102. FIG. 1B shows the encapsulation ring 102 is formed in a quadrilateral shape, but it is not so limited in shape. As in the previous embodiment, the overflow reservoir 110 is connected to the inside of the encapsulation ring 102 by air vents 114.

In another embodiment of the encapsulation ring 102, there is an additional overflow reservoir 110a. In one embodiment, the additional overflow reservoir 110a is located opposite the overflow reservoir 110. In another embodiment, the additional overflow reservoir 110a is round in shape and is located at a corner of the encapsulation ring that is opposite the overflow reservoir 110. In yet another embodiment, the encapsulation ring 102 has both types of such additional overflow reservoirs 110a and associated air vents 114a.

In one embodiment, the encapsulation spacer 102 is made of metal. In another embodiment, the encapsulation spacer is made of thermoplastic. The encapsulation spacer may be formed by conventional machining, moulding, etching, laser cutting or shaping methods. For example, the encapsulation spacer 102 may be made by etching on a metal piece, preferably from copper. In another example, the encapsulation spacer 102 may be made by masking a metal piece and building the exposed metal piece by plating it with a metal, such as copper. The material of the encapsulation spacer is not so limited; any other material that is low cost and easily formed by conventional machining or shaping may be used.

In FIGS. 1A and 1B, the encapsulation spacer/ring 102 is shown to consist of a single layer. In another embodiment, the encapsulation spacer/ring 102a is made up of two or more layers, where adjacent layers may be joined by means of adhesive. The depths of the air vents 114, 114a and overflow reservoirs 110, 110a may be defined by the thickness of the relevant layer that make up the encapsulation spacer/ring 102a. An advantage of this embodiment is that the layers to build the encapsulation spacer 102 are either plain solid or have the aperture 104; in this way, the height of the encapsulation spacer 102 is configurable according to the dies 160 to be encapsulated.

Figure 2E:
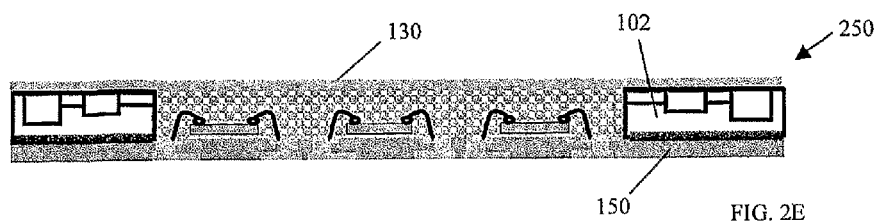
Figure 2F:
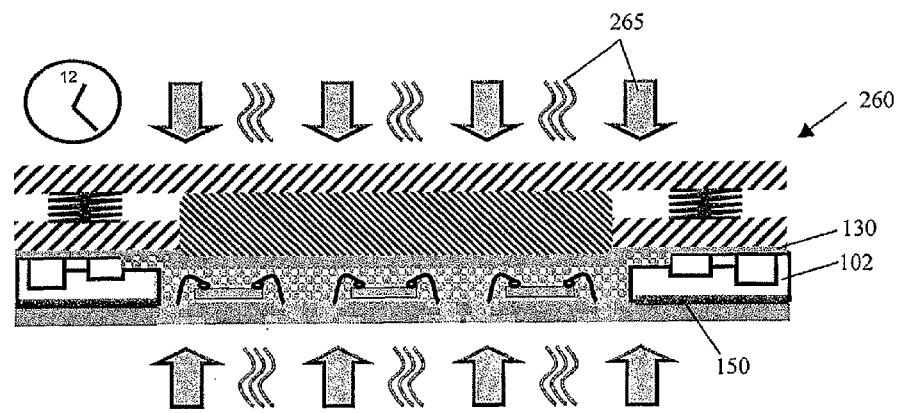
Figure 2G:
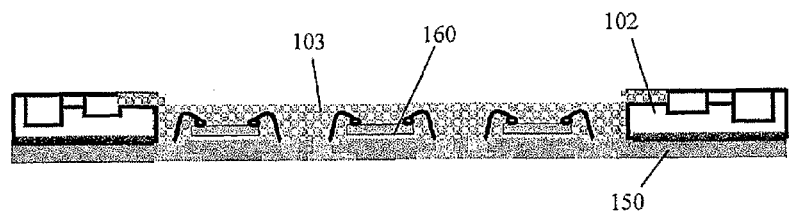

In use, the encapsulation spacer 102, 102a may be mounted on the substrate 150 by means of adhesive. FIGS. 2A-2G illustrate the process 200 of encapsulating semiconductor dies/chip using the above encapsulation spacer/ring 102, 102a. As shown in FIG. 2A, groups of dies/chips 160 are mounted 210 on the substrate 150 according to the conductive patterns on the substrate. In FIG. 2B, the encapsulation spacer/ring 102, 102a is mounted 220 on the substrate 150 by means of adhesive 118. The encapsulant 103 is then dispensed 230 into each aperture 104 of the encapsulation spacer 102, 102a or inside the encapsulation ring 102, 102a until the encapsulant 103 reaches the top of the encapsulation spacer/ring 102, 102a and is about to overflow into the overflow reservoir(s) 110, 110a via the respective air vents 114, 114a. Dispensing of the encapsulant may be carried out manually or automatically via a metering system. As shown in FIG. 2D, pressure may be applied 240 on the surface of the encapsulant after an aperture is filled. An overlay sheet 130 is then applied 250 over the top of the encapsulation spacer/ring 102, 102a to cover the encapsulant 103. The entire assembly is then disposed 260 inside a press where a platen, shaped and dimensioned according to the aperture 104 or inside of the encapsulation ring 102, 102a, applies 265 heat and pressure to the encapsulant 103. The heat and pressure may be maintained for a predetermined period of time to allow the encapsulant 103 to cure, at least partially. FIG. 2G shows the dies 160 on the substrate 150 being encapsulated inside the aperture 104 of the encapsulation spacer 102, 102a at the end of the process 100. The entire assembly may then be disposed inside an oven to complete curing the encapsulant 103. After the encapsulant 103 is fully cured, the encapsulated dies/chips are singulated to form individual semiconductor packages.

Figure 3A:
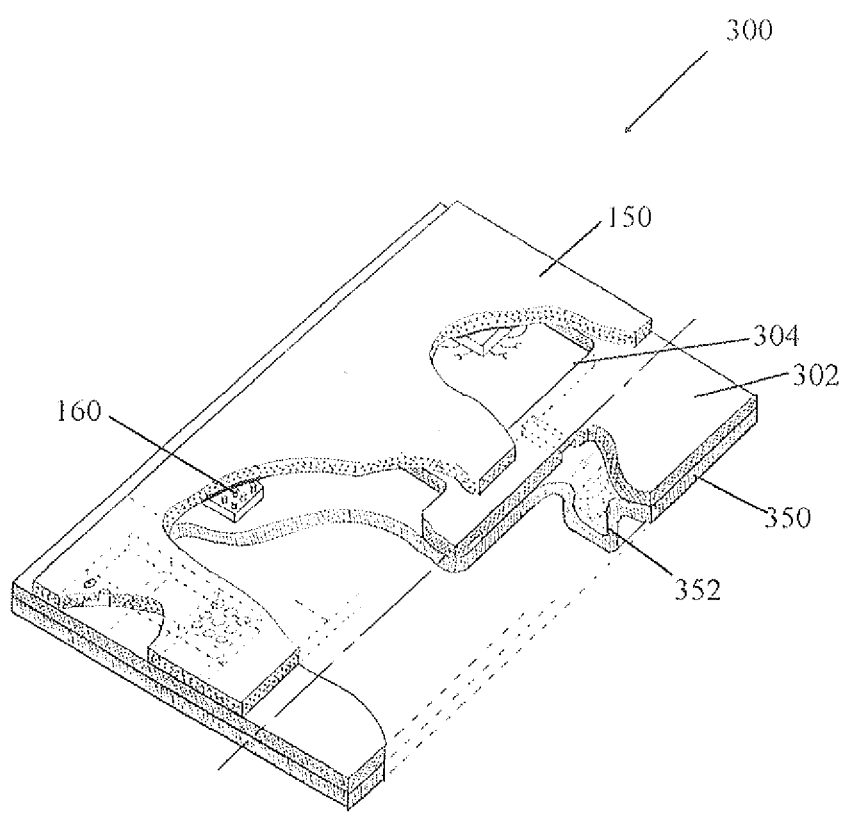
FIG. 3A illustrates an encapsulation system according to another embodiment of the present invention.

FIG. 3A shows an encapsulation system 300 according to another embodiment of the present invention. The encapsulation system 300 is made up of the substrate/carrier 150, an encapsulation spacer 302 and an encapsulant delivery layer 350. As shown in FIG. 3A, the encapsulation spacer 302 is attached to the substrate/carrier 150 and the encapsulant delivery layer 350 is in turn attached to the encapsulation spacer 302; such attachments may be by means of adhesive 118. The present invention is clearer when individual parts of the encapsulation system 300 are described.

Figure 3B:
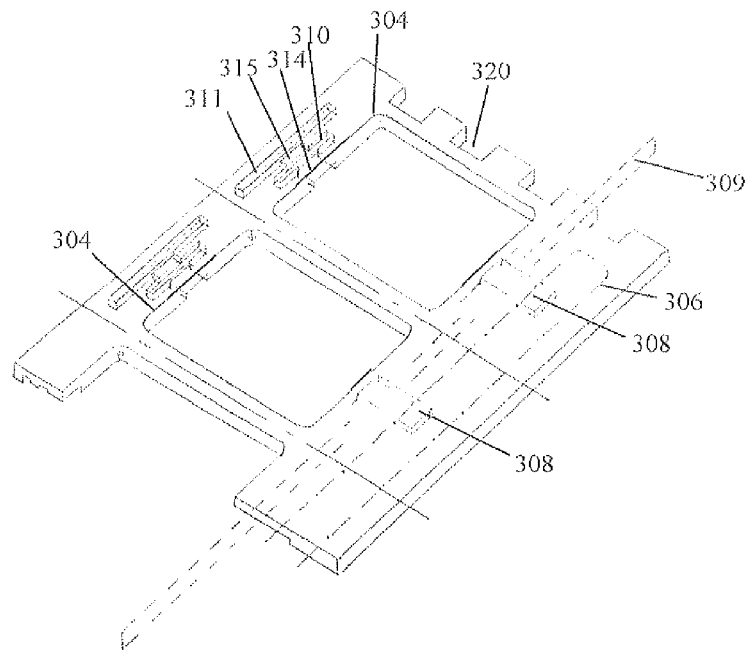
FIG. 3B illustrates an encapsulation spacer according to an embodiment of the encapsulation system shown in FIG. 3A, whilst

FIG. 3B shows the encapsulation spacer 302 according to an embodiment of the present invention. The encapsulation spacer 302 is exemplified as an elongate strip, which has a plurality of apertures 304. In FIG. 3B, the apertures 304 are aligned in a row along a longer dimension of the elongate strip for simpler description but they are not so limited. As in the previous embodiment, a group of semiconductor dies/chips 160 are attached to the substrate/carrier 150 such that the dies/chips are seen within an aperture 304 and a thickness of the encapsulation spacer 302 at the aperture defines a thickness of the encapsulant around the die/chip 160.

On the shorter dimension of the elongate strip, as shown in FIG. 3B, there are four reliefs 320. The reliefs 320 are dimensioned so that they provide finger and thumb gripping spaces, for example when the encapsulation spacer 302 is to be peeled off from the substrate/carrier 150 or when the encapsulant delivery layer 350 is to be peeled off from the encapsulation spacer 302 after the encapsulant has cured.

The right side of the encapsulation spacer 302 has a larger margin than the left hand side, as seen in FIG. 3B. In the right hand margin, the closed phantom line 306 shows the location of the encapsulant 103 stored in the encapsulant delivery layer 350 when the encapsulant delivery layer 350 is attached to the encapsulation spacer 302. A recessed gate 308, on the rear side of the encapsulation spacer 302 as seen in FIG. 3B, extends from inside the closed phantom line 306 to the associated aperture 304. A plane 309 defined by another phantom line cuts through the recessed gate 308. The area of the encapsulation spacer 302 on the right hand side of the plane 309 may be broken or sheared off after encapsulant is delivered into the apertures 304 and has at least partially cured. On the left and rear side of each aperture 304, as seen in FIG. 3B, is an overflow reservoir 310. An air vent 314 connects each overflow reservoir 310 to the respective aperture 304.

In one embodiment, the encapsulation spacer 302 is made of a unitary layer. For example, when the encapsulation spacer 302 is metallic, the built-up layer may be deposited by plating a metal on a substrate whilst depressions or apertures may be formed by masking and etching away the exposed metal surface. In another embodiment, the encapsulation spacer 302a is made up of two or more layers; the adjacent layers may be joined by means of adhesive; in another example, the adjacent layers may be laminated together; the depths of the recessed gates 308, air vents 314 and overflow reservoirs 310 may be defined by the thicknesses of the relevant layers that make up the encapsulation spacer 302a.

Figure 3C:
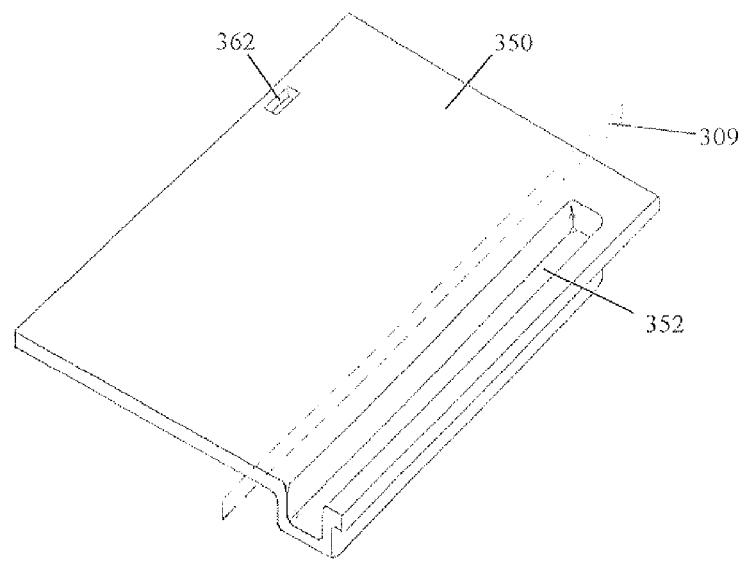
FIG. 3C illustrates an encapsulant delivery layer for use with the encapsulation spacer shown in FIG. 3B.

FIG. 3C shows an encapsulant delivery layer 350 according to an embodiment of the present invention for use with the encapsulation spacer 302,302a. As shown in FIG. 3A, the encapsulant delivery layer 350 is dimensioned to match the encapsulation spacer 302,302a, where the encapsulant is stored in a reservoir 352. The encapsulant delivery layer 350 is made up of a thin and flexible plastic but is strong and resilient enough to hold the encapsulant in the reservoir 352. In an example, the encapsulant delivery layer 350 may be made by conventional plastic moulding, such as injection or transfer moulding. Before use, the encapsulant delivery layer 350 may be covered by a peel-off layer; by removing the peel-off layer, an adhesive on the encapsulant delivery layer 350 is exposed and the encapsulant delivery layer 350 can then be attached onto the encapsulation spacer 302,302a. In use, the encapsulation system 300 is placed inside a press and pressure on the reservoir 352 collapses the reservoir to deliver the encapsulant through the recessed gate 308 into the associated aperture 304 to encapsulate the dies/chips 160 disposed on the substrate/carrier 150. After the encapsulant around the dies/chips has cured, the encapsulant delivery layer 350 may be peeled off; alternatively, the encapsulation spacer 302, 302a together with the encapsulant delivery layer 350 may be broken or sheared at the plane 309.

Figure 3D:
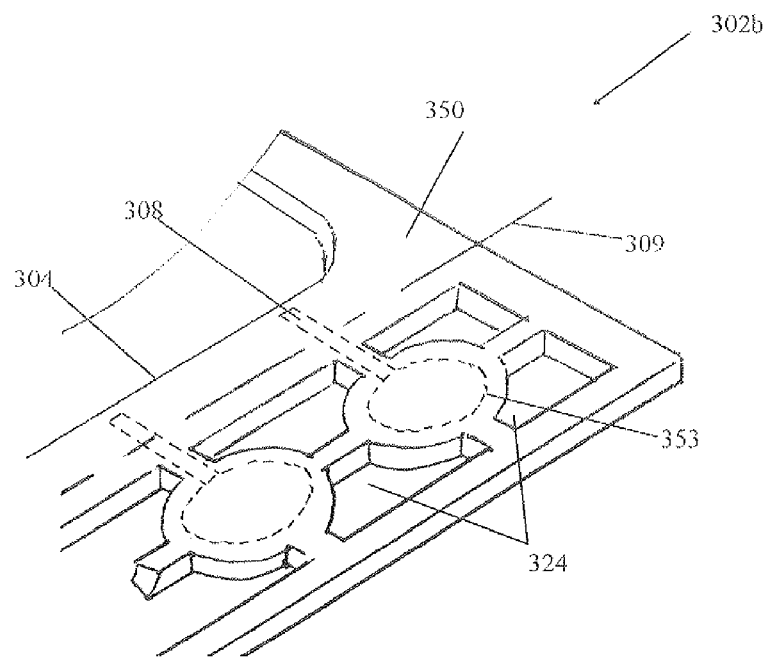
FIG. 3D illustrates an encapsulation spacer according to another embodiment of the encapsulation system shown in FIG. 3A, whilst
Figure 3E:
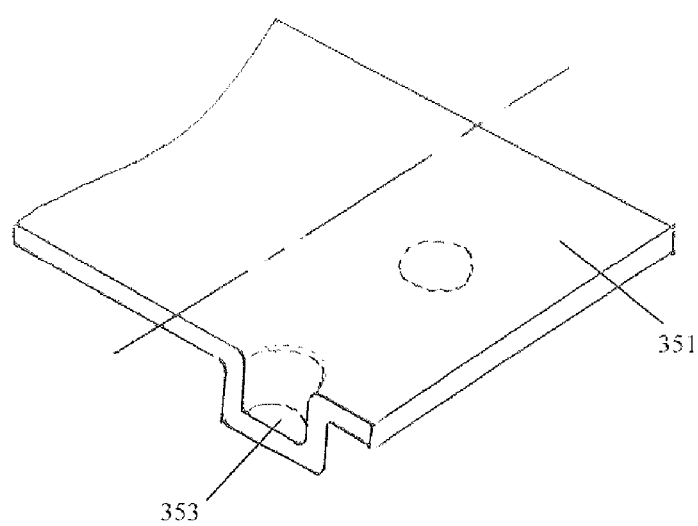
FIG. 3E illustrates an encapsulant delivery layer for use with the encapsulation spacer shown in FIG. 3D.

FIG. 3D shows an encapsulation spacer 302b according to another embodiment of the present invention. The encapsulation spacer 302b is similar to the encapsulation spacer 302, 302a except that the recessed gate 308 starts with a recess 308a. Each recess 308a corresponds with a discrete encapsulant reservoir 353 on a matching encapsulant delivery layer 351 shown in FIG. 3E. In another embodiment, the area around the recess 308a may be shaped and dimensioned to overlap the associated encapsulant reservoir 353, and the area around the recessed gate 308 is sufficient to adhere to the encapsulant delivery layer 351 to allow encapsulant to be delivered into the aperture 304, such that material around the recess 308a and recessed gate 308 is redundant; this redundant material when removed forms openings 324.

Figure 4A:
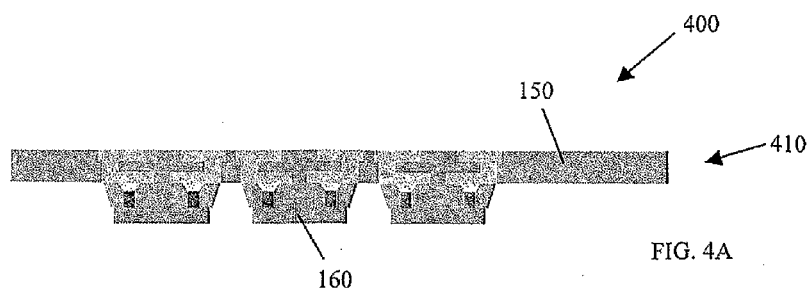
FIGS. 4A-4F illustrate the various steps in using the encapsulation system shown in FIG. 3A.
Figure 4B:
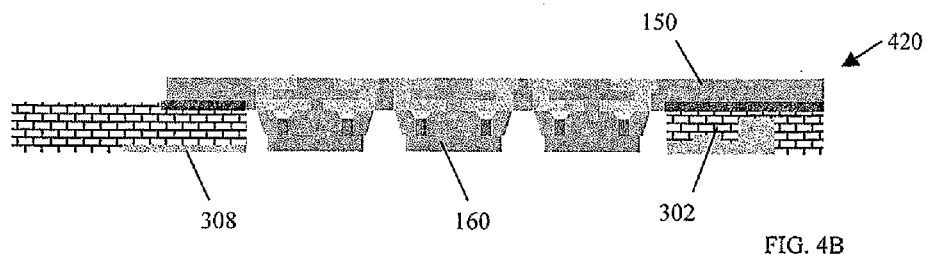
Figure 4C:
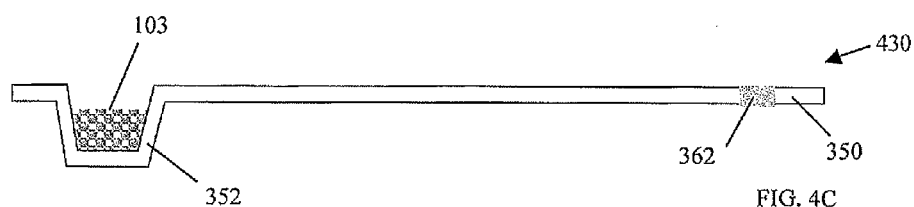
Figure 4D:
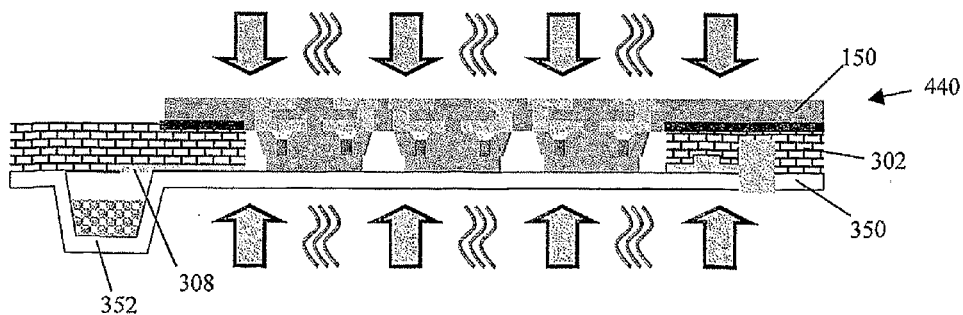
Figure 4E:
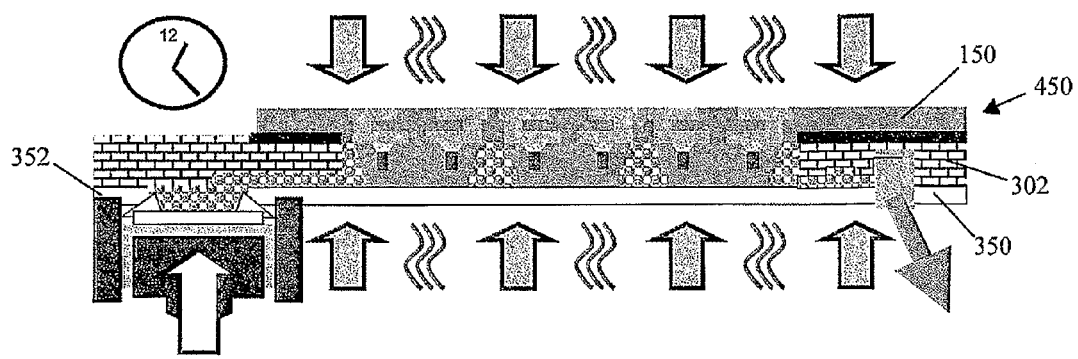
Figure 4F:
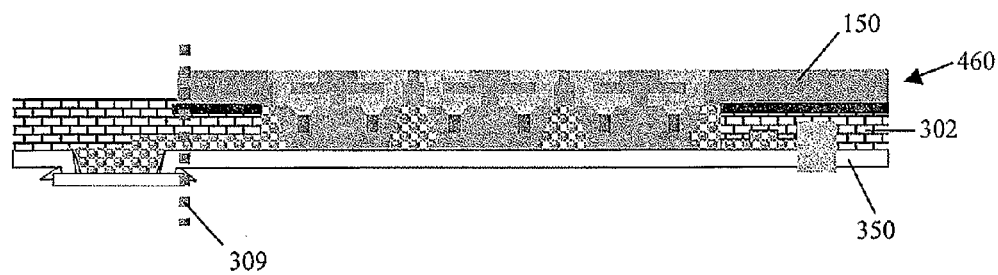

FIGS. 4A-4F illustrate the process 400 of encapsulating semiconductor dies using the encapsulating spacer 302, 302a, 302b. As shown in FIG. 4A, groups of dies 160 are mounted 410 on the substrate 150 according to the conductive pattern on the substrate. In FIG. 4B, the encapsulation spacer 302, 302a, 302b is mounted 420 on the substrate, for example by adhesive. In FIG. 4C, the reservoir or pot 352, 353 of an encapsulant delivery layer 350, 351 is filled 430 with encapsulant 103. In FIG. 4D, the encapsulant delivery layer 350, 351 is then attached to the encapsulation spacer 302, 302a, 302b. The entire assembly or system 300 is then disposed inside a press where a platen, shaped and dimensioned according to the aperture 304, applies 440 heat and pressure to the encapsulant 103. This is followed by collapsing 450 the reservoir or pot 352, 353 of the encapsulant delivery layer 350, 351, for example, by extending a ram on the reservoir/pot, as shown in FIG. 4E. The heat and pressure may be maintained for a predetermined period of time to allow the encapsulant 103 to cure, at least partially, as shown in FIG. 4F. After the encapsulant is cured and the assembly is removed from the press, the encapsulation spacer 302, 302a, 302b and encapsulant delivery layer 350, 351 are broken or sheared off 460 along plane 309 before the encapsulated dies are singulated to form individual semiconductor packages. Alternatively, the encapsulant delivery layer 350, 351 are removed prior to singulation to form individual semiconductor packages.

While specific embodiments have been described and illustrated, it is understood that many changes, modifications, variations and combinations thereof could be made to the present invention without departing from the scope of the invention. For example, the encapsulation spacer 102, 102a, 302, 302a, 302b may have a vacuum channel 111, 311 disposed alongside each overflow reservoir 110, 110a, 310. Each vacuum channel 111, 311 may have a vacuum port 312 for connection to a vacuum system as when necessary; a vacuum opening 362 corresponding to the vacuum port 312 may then be provided on the encapsulant delivery layer 350, 351. A control gate 315 connects an overflow reservoir to the associated vacuum channel 311. Whilst a panel layout of the encapsulation system 300 has been described, the system 300 is also applicable for use with individual encapsulation rings and the encapsulant delivery layer 351.

The invention claimed is:

1. An encapsulation system for semiconductor packaging comprising:
    a substrate;
    an encapsulation spacer formed with one or more apertures for attaching onto the substrate; and
    an encapsulant delivery layer made of a flexible plastic and having a reservoir for storing an encapsulant, so that when the encapsulant delivery layer is attached onto the encapsulation spacer, the one or more apertures bound by the encapsulant delivery layer and the substrate define one or more volumes such that semiconductor chips disposed on the substrate and enclosed inside the one or more volumes are operated to be encapsulated with the encapsulant when the reservoir is collapsed by applying a force.

2. The encapsulation system according to claim 1, wherein the one or more apertures is/are configurable in shape and dimensions according to patterns of conductive elements on the substrate.

3. The encapsulation system according to claim 1, further comprising a recessed gate on the encapsulation spacer for delivering the encapsulant from the reservoir into an associated aperture.

4. The encapsulation system according to claim 3, further comprising an overflow reservoir disposed alongside an associated aperture, and the overflow reservoir is connected to the associated aperture by an air vent.

5. The encapsulation system according to claim 4, further comprising a vacuum channel disposed alongside an associated overflow reservoir, and the vacuum channel is connected to the associated overflow reservoir by a control gate.

6. The encapsulation system according to claim 5, wherein a vacuum channel further comprises a vacuum port for connection to an external vacuum system.

7. The encapsulation system according to claim 1, wherein the encapsulation spacer comprises two or more layers in order to build up the volume in each of the one or more apertures, and the adjacent layers are joined by means of adhesive.

8. The encapsulation system according to claim 5, wherein the recessed gate, overflow reservoir, air vent, vacuum channel or control gate is independently configured in shapes and dimensions.

9. The encapsulation system according to claim 8, wherein depth of the recessed gate, overflow reservoir, air vent, vacuum channel or control gate is configured by forming the feature with a thickness of two or more layers constituting the encapsulation spacer.

10. The encapsulation system according to claim 1, wherein the encapsulation spacer further comprises a relief along an outer periphery, said relief allows one to grip on the encapsulant delivery layer to detach the encapsulant delivery layer from the encapsulation spacer after the encapsulant has been dispensed.

11. The encapsulation system according to claim 1, wherein the encapsulation spacer is metallic and is unitarily formed with the substrate.

12. The encapsulation system according to claim 1, wherein height of the encapsulation spacer is configured according to height of the semiconductor chips to be encapsulated.

13. An encapsulant delivery layer for semiconductor packaging comprising:
   a molded flexible plastic shaped and dimensioned to match an encapsulation spacer and is formed with a reservoir for storing an encapsulant; and
   a peel-off layer, which is removed to expose an adhesive layer on the encapsulant delivery layer to allow the encapsulant delivery layer to be attached to the encapsulation spacer, so that the encapsulant is dispensed from the reservoir to encapsulate semiconductor chips located inside an aperture in the encapsulation spacer when the reservoir is collapsed by a force.

* * * * *